United States Patent
Chen

(10) Patent No.: US 6,845,476 B2
(45) Date of Patent: Jan. 18, 2005

(54) METHOD FOR TESTING A NON-VOLATILE MEMORY

(75) Inventor: Wei-Hsin Chen, Changhua (TW)

(73) Assignee: Winbond Electronics Corporation (TW)

( * ) Notice: Subject to any disclaimer, the term of this patent is extended or adjusted under 35 U.S.C. 154(b) by 555 days.

(21) Appl. No.: 09/901,345

(22) Filed: Jul. 9, 2001

(65) Prior Publication Data
US 2002/0144196 A1 Oct. 3, 2002

(30) Foreign Application Priority Data
Mar. 30, 2001 (TW) ........................................ 90107736 A

(51) Int. Cl.$^7$ ............................................. G11C 29/00
(52) U.S. Cl. .................. 714/718; 711/103; 365/185.33
(58) Field of Search ................. 714/718, 724, 714/736; 365/185.33; 711/103

(56) References Cited

U.S. PATENT DOCUMENTS

| | | | | |
|---|---|---|---|---|
| 4,654,829 A | * | 3/1987 | Jiang et al. ............ 365/189.03 |
| 5,079,725 A | * | 1/1992 | Geer et al. .................. 714/726 |
| 6,088,284 A | * | 7/2000 | Lee et al. .............. 365/230.03 |
| 6,133,727 A | * | 10/2000 | Chun et al. .............. 324/158.1 |
| 6,367,042 B1 | * | 4/2002 | Phan et al. .................. 714/733 |

* cited by examiner

Primary Examiner—Guy J. Lamarre
Assistant Examiner—John P. Trimmings
(74) Attorney, Agent, or Firm—Ladas & Parry LLP

(57) ABSTRACT

The present invention discloses a method for testing a non-volatile memory, characterized in that the code assigned by the client is written in at least one non-volatile memory in advance, and then a particular pin of the non-volatile memory is cut, such as a write enabling pin for avoiding the mistake of rewriting. After restarting a testing machine, the code written in the non-volatile memory is read out to compare it with the code retrieved from a controlling program of the testing machine. If the comparing result is identical, it means that the code retrieved by the controlling program of the testing machine is correct; otherwise, the code retrieved by the controlling program is incorrect.

6 Claims, 2 Drawing Sheets

METHOD FOR TESTING A NON-VOLATILE MEMORY

BACKGROUND OF THE INVENTION

1. Field of the Invention

The present invention relates to a method for testing a non-volatile memory, and more particularly, to a method for testing whether the non-volatile memory is written with a code assigned by the client or not.

2. Description of the Prior Art

To verify the validity of a non-volatile memory (such as a flash memory or an electrically erasable programmable ROM (EEPROM)), a series of testing procedures are performed before the non-volatile memory leaves the factory.

FIG. 1 depicts a flow chart of the conventional method for testing a non-volatile memory. In step 101, it depicts the beginning of the flow chart of the conventional testing method. In step 102, an open/short test of the pins of the non-volatile memory is executed, if it is affirmative, step 103 is proceeded; otherwise, step 106 is proceeded and the memory is binned to binning category 2. In step 103, a functional test of the non-volatile memory is executed, if it is affirmative, step 104 is proceeded; otherwise, step 106 is proceeded with and the memory is binned to binning category 3. In step 104, an erasable and programmable test of the non-volatile memory is executed to determine whether the data of the non-volatile memory can be erased and new data can be rewritten in the memory or not, if it is affirmative, step 105 is proceeded; otherwise, step 106 is proceeded and the memory is binned to binning category 4. In step 105, a code test of the non-volatile memory is executed. In the code test, the code written in the non-volatile memory is read out and compared it with the original code. If the result is identical, step 106 is proceeded and the memory is binned to binning category 1; otherwise the memory is binned to binning category 5. All memory will be binned in step 106. In step 107, the flow chart of the conventional testing method ends.

In other words, the opening/shorting of the pins, logic function, erasable function and reading writing function of the memory can be checked in the conventional method, but it cannot be checked whether the code written in the memory is assigned by the client or not. For example, if the controlling program of the testing machine retrieves a code which is not assigned by the client, the result of the read write function test will affirmative, since the read write function test of the memory is to read out the code written in the memory and compare it with the code retrieved by the controlling program of the testing machine.

In accordance with the problem of prior art, the present invention discloses a method that can not only test the short/open of the pins, logic function, erasable function and read write function of the memory but also test whether the code written in the memory is assigned by the client or not.

SUMMARY OF THE INVENTION

An object of the present invention is to provide a method for testing the non-volatile memory which can execute not only open/short test of the pin, and logic function test, erasable and programmable test of the memory and the readable and write function test of the code, but also can verify whether the code written in the non-volatile memory is assigned by the client or not.

Another object of the present invention is to provide a method for testing a non-volatile memory, which can test the code retrieved by the controlling program and the setting of the testing machine at the same time.

In order to achieve the above objects and to avoid the disadvantages of the prior art, the present invention discloses a method for testing a non-volatile memory, comprising the following steps:

(a) preparing a first type correlation sample and a second type correlation sample, wherein the first type correlation sample is a non-volatile memory with a code assigned by the client and a particular pin is cut, and the second type correlation sample is a non-volatile memory which has been verified;

(b) after restarting the testing machine, executing the open/short test of the particular pin of the first type correlation sample and the second type correlation sample, if the particular pin is short, proceeding to step (c); otherwise, proceeding to step (d);

(c) comparing the code of the first correlation sample with the code retrieved by the controlling program of the testing machine; if identical, the code retrieved by the controlling program is correct; otherwise, the code retrieved by the controlling program is incorrect; and (d) executing the test for the second correlation sample, if identical, the setting of the testing machine is correct; otherwise, the setting of the machine is incorrect.

The present invention is characterized in that the code assigned by the client is written in at least one non-volatile memories in advance, and then a particular pin of those non-volatile memories is cut, such as a write enabling pin to avoid the mistake of rewriting. After restarting the testing machine, the code written in the non-volatile memory is read out to compare with the code retrieved by the controlling program of the testing machine. If the comparing result is identical, the code retrieved by the controlling program of the testing machine is correct; otherwise, the code retrieved by the controlling program is incorrect. Furthermore, the method of the present invention can test another non-volatile memory, which had been verified, after restarting the testing machine, if identical, the setting of the testing machine is correct; otherwise, the setting of the machine is incorrect.

The foregoing and other objects and advantages of the invention and the manner in which the same are accomplished will become clearer based on the following detailed description taken in conjunction with the accompanying drawings.

DETAILED DESCRIPTION OF THE INVENTION

Figure 1:
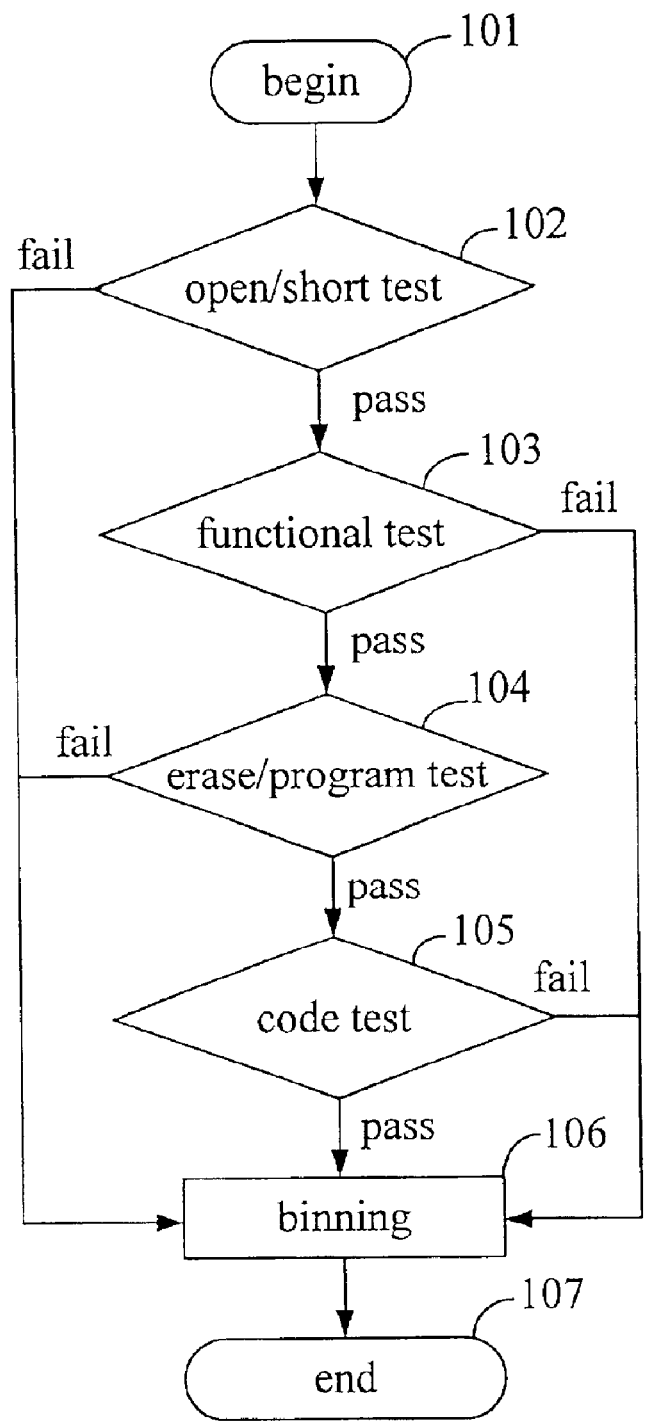
FIG. 1 depicts a conventional method for testing a non-volatile memory.

Before proceeding with the flow chart of the present invention, a code assigned by the client is written in a plurality of non-volatile memories with a write enabling pin (EA pin for short in the present invention). Then, the EA pin of the non-volatile memory is cut to avoid rewriting a code because of personal mistakes. The plurality of non-volatile memories without the EA pin are treated as samples for testing whether the code retrieved by the controlling program of the testing machine is assigned by the client or not. The pluralities of non-volatile memories are referred to as first correlation sample or golden sample. Moreover, a plurality of non-volatile memories passing the conventional testing method, shown in FIG. 1, are provided and treated as second correlation samples for checking whether the setting of the testing machine is correct or not when it was restarted. After the first correlation sample and the second correlation sample passed through the process of the present invention, the process for testing the manufactured product is executed.

Figure 2:
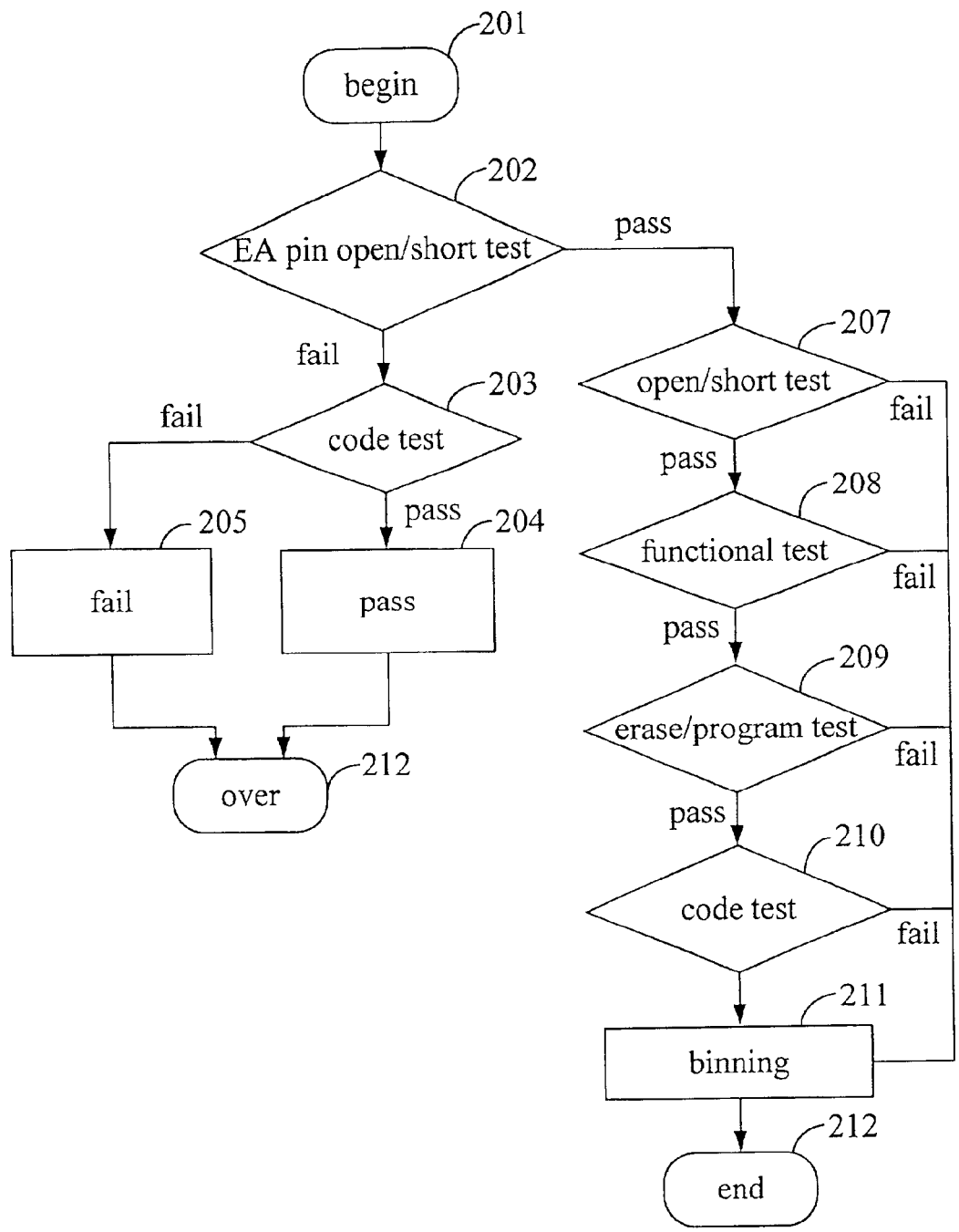
FIG. 2 depicts a method for testing a non-volatile memory of a preferred embodiment according to the present invention.

FIG. 2 depicts a preferred embodiment according to the present invention. In step 201, it depicts the beginning of the flow chart of the present invention. In step 202, the open/short test of the EA pin is executed to sort the first correlation sample and the second correlation sample. If the result of the open/short test of the EA pin is not short, step 207 is proceeded; otherwise, step 203 is proceeded. In step 203, the code test is executed which reads the code of the first correlation sample and compares it with the code retrieved by the controlling program of the testing machine. If the result is identical, step 204 is proceeded, and the code retrieved by the controlling program is correct. Otherwise, step 205 is proceeded, and the code retrieved by the controlling program is incorrect.

In step 207, an open/short test of the EA pin is executed. Only the second correlation sample is tested at step 207, since the first correlation sample had been sorted out at step 202. If the result of the open/short lest of the EA pin is not short, step 208 is proceeded; otherwise, step 211 is proceeded to bin the second correction sample to binning category 2. In step 208, a logic functional test of the second correlation sample is executed, if it passes, step 209 is proceeded; otherwise, step 211 is proceeded to bin the second correction sample to binning category 3. In step 209, an erasable and programmable test of the second correlation sample is executed to determine whether the data of second correlation sample can be erased and new data can be rewritten second correlation sample or not. If the result of step 209 is affirmative, step 210 is proceeded; otherwise, step 211 is proceeded and the second correction sample is binned to binning category 4. In step 210, a code test is executed that compares the code written in the second correlation sample with the code retrieved by the controlling program of the testing machine, so as to determine whether the read/write function of the second correlation sample is correct or not. If the result of step 210 is affirmative, step 211 is proceeded and the second correlation sample is binned to binning category 1; otherwise, the second correlation sample is binned to binning category 5. All of the second correlation samples are binned in step 211. In step 212, the flow chart of the present invention ends. Since the second correlation sample has been verified as a correct non-volatile memory, if there are any second correlation samples that are binned to the binning categories 2,3,4 or 5, it means that the setting of the testing machine is incorrect and it needs to be adjusted before the process for testing the manufactured product is executed.

It should be noted that the first correlation sample with out the EA pin cannot be applied in the conventional method, since the first correlation sample will be binned to binning category 2 in the open/short test in step 102 of the conventional method, and the code test will not be executed. In addition, if the EA pin of the memory of the manufactured product falls off because of carelessness during the process of the present invention, step 203 will be proceeded. Since this non-volatile memory has not been written with any code; the result of the code test is fail. Thus, the method according to the present invention can also be applied to the mass-production stage.

The methods and features of this invention have been sufficiently described in the above examples and descriptions. It should be understood that any modifications or changes without departing from the spirits of the invention are intended to be covered in the protection scopes of the invention.

What is claimed is:

1. A method for testing a non-volatile memory, comprising the following steps:

(a) preparing a first type correlation sample and a second type correlation sample, wherein the first type correlation sample is a non-volatile memory written with a code assigned by a client and a particular pin thereof is cut, and the second type correlation sample is a non-volatile memory which has been verified;

(b) after restarting a testing machine, executing an open/short test for the particular pin of the first type correlation sample and the second type correlation sample, if the particular pin is opened, proceeding to step (c), otherwise, proceeding to step (d);

(c) comparing the code of the first correlation sample with a code retrieved from a controlling program of the testing machine; if identical, the code retrieved by the controlling program is correct; otherwise, the code retrieved by the controlling program is incorrect; and (d) executing a predetermined test for the second correlation sample, if it is affirmative, the setting of the testing machine is correct; otherwise, the setting of the testing machine is incorrect.

2. The method of claim 1, wherein the particular pin is a write enabling pin.

3. The method of claim 1, wherein the predetermined test of step (d) further comprises at least one of the following steps:

(d1) executing an open/short test of the particular pin;

(d2) executing a functional test;

(d3) executing an erasable and programmable test; and (d4) executing a code test.

4. The method of claim 1, further comprising the following step:

(e) testing the non-volatile memory after the code retrieved by the controlling program and the setting of the testing machine are correct.

5. A method for testing with a non-volatile memory comprising the steps of:

(a) writing a code assigned by a client in at least one non-volatile memory;

(b) cutting a write enabling pin of the non-volatile memory to avoid a mistake of rewriting;

(c) reading out and comparing the code written in the non-volatile memory with a code retrieved by a controlling program of a testing machine;

after the testing machine is restarted; and (d) determining the code retrieved by the controlling program of the test machine to be correct if the compared codes are identical.

6. The method of claim 5, further comprising the step of testing at least one manufactured product of the non-volatile memory which has been verified after restarting the testing machine, if it is affirmative, the setting of the testing machine is correct; otherwise, the setting of the testing machine is incorrect.

* * * * *